United States Patent

Suzuki et al.

[11] Patent Number: 5,161,171
[45] Date of Patent: Nov. 3, 1992

[54] DIGITAL DATA TRANSMITTING APPARATUS

[75] Inventors: Hideto Suzuki; Yoshikazu Kurose; Shinji Aoki, all of Kanagawa, Japan

[73] Assignee: Sony Corporation, Tokyo, Japan

[21] Appl. No.: 584,700

[22] Filed: Sep. 19, 1990

[30] Foreign Application Priority Data

Sep. 20, 1989 [JP] Japan .................................. 1-244468

[51] Int. Cl.$^5$ .............................................. H04L 7/08
[52] U.S. Cl. ..................... 375/108; 360/32; 375/116
[58] Field of Search ............... 375/106, 108, 114, 116; 370/105.4, 106; 371/37.1, 37.5, 42; 360/32, 51

[56] References Cited

U.S. PATENT DOCUMENTS 4,890,304 12/1989 Annamalai ........................... 375/114
4,984,238 1/1991 Watanabe et al. ................... 370/106

Primary Examiner—Benedict V. Safourek
Attorney, Agent, or Firm—Alvin Sinderbrand; William S. Frommer

[57] ABSTRACT

In an apparatus for transmitting digital data which includes information data and synchronous data having a plural-byte code arranged in a plural-byte code of the information data; the top bit position of the sync code is predicted by converting the transmitted digital data into parallel data at a desired timing and then comparing each byte of the parallel data with a particular byte of the sync code; and the sync code is detected in the transmitted digital data by first extracting, from the parallel data, a length corresponding to the plural-byte sync code starting from the predicted top bit position of the sync code and then comparing the extracted parallel data with the sync code.

4 Claims, 12 Drawing Sheets

| INTERVAL | SW1 | SW2 | SW3 | SW4 |
|---|---|---|---|---|
| 0 BLOCK | T2 | T2 | T2 | T2 |
| 1 BLOCK | T1 | T2 | T2 | T2 |
| 2 BLOCK | T1 | T1 | T2 | T2 |
| 3 BLOCK | T1 | T1 | T1 | T2 |
| 4 BLOCK | T1 | T1 | T1 | T2 |

F I G. 11

| TERMINAL | S$_{SYNC}$ | S$_{SYNC1}$ | S$_{SYNC2}$ | S$_{SYNC3}$ | S$_{SYNC4}$ |
|---|---|---|---|---|---|
| T11 | x | x | x | x | 1 |
| T12 | x | x | x | 1 | 0 |
| T13 | x | x | 1 | 0 | 0 |
| T14 | x | 1 | 0 | 0 | 0 |
| T15 | 1 | 0 | 0 | 0 | 0 |
| T16 | 0 | 0 | 0 | 0 | 0 |

F I G. 16

| TOP BIT POSITION | BLOCK SYNC CODE (TBL_DT) | P./P. SYNC CODE (TBL_PR) |
|---|---|---|
| 1 | 000000001 | 111111110 |
| 2 | 000000011 | 111111100 |
| 3 | 000000110 | 111111001 |
| 4 | 000001101 | 111110010 |
| 5 | 000011010 | 111100101 |
| 6 | 000110100 | 111001011 |
| 7 | 001101000 | 110010111 |
| 8 | 011010001 | 100101110 |
| 9 | 110100011 | 001011100 |

FIG. 13

| SHIFT SIGNAL | EXTRACTED BIT |
|---|---|
| S0 | A11 – A49 |
| S1 | A12 – A51 |
| S2 | A13 – A52 |
| S3 | A14 – A53 |
| S4 | A15 – A54 |
| S5 | A16 – A55 |
| S6 | A17 – A56 |
| S7 | A18 – A57 |
| S8 | A19 – A58 |

FIG. 14

DIGITAL DATA TRANSMITTING APPARATUS

BACKGROUND OF THE INVENTION

1. Field of the Invention

The present invention relates to an apparatus for transmitting digital data which includes information data and synchronous data, and more particularly to an apparatus adapted for detecting a sync code in reproduced information data based on, for example, an ID-1 format.

2. Description of the Prior Art

A known apparatus designed to perform a high-density recording of information data is based on an ANSI ID-1 format (Third Draft, PROPOSED AMERICAN NATIONAL STANDARD 19 mm TYPE ID-1 INSTRUMENTATION DIGITAL CASSETTE FORMAT X3B6/88-12 Project 592-D 1988-03-22).

In such a data recorder, error correction of the information data is effected by employing a product encoding notation with a Reed-Solomon code and then recording it on a magnetic tape, so that, in a playback mode, any transmission error may be thereby detected and corrected.

The ANSI ID-1 format used in the known data recorder will now be further described below:

FIG. 1 diagrammatically illustrates an example of a recording pattern formed on a magnetic tape by the data recorder based on the ID-1 format. In this diagram, ANN indicates an annotation track for recording notes thereon, and data tracks TR1, TR2, TR3, ... are for recording information data, with one sector being formed for each data track. The data tracks are recorded with alternately different azimuth angles. Further shown are a control track CTL for recording a control signal, and a time code track TC for recording a time code.

The content of each of the data tracks TR1, TR2, TR3, ... is prescribed as illustrated in FIG. 2. Specifically, each data track TR corresponds to one sector SEC and is constituted by a preamble PR, a data recording portion DT and a postamble PS. The preamble PR is recorded in the top portion of the respective data track formed obliquely across the tape.

Each preamble PR is composed of a 20-byte ascending sequence RUS, a 4-byte sync code $SYNC_{PR}$, 4-byte sector identification data $ID_{SEC1}$, and 6-byte auxiliary data $DT_{AUX}$.

Each data recording portion DT is composed of 256 sync blocks BLK ($BLK_0$, $BLK_1$, $BLK_2$, ... $BLK_{255}$), and the input information data is recorded in this portion DT. Each sync block BLK consists of a 4-byte block sync code $SYNC_{BLK}$, a 1-byte block identification $ID_{BLK}$, 153-byte inner data DI (inner-coded input information data) and an 8-byte parity code RI based on Reed-Solomon code notation.

Each postamble PS is composed of 4-byte sync code $SYNC_{PS}$ and 4-byte sector identification data $ID_{SEC2}$.

FIG. 3 shows a recording system 1 of the ID-1 format data recorder. In this recording system 1, the input information data is recorded after being encoded for error correction by a product code notation.

More particularly, 8-bit (1-byte) input information data $DT_{USE}$ is supplied to an outer encoder 2. By the use of a predetermined generating polynomial with regard to the data blocks each composed of 118 bytes of the input information data $DT_{USE}$, the outer encoder 2 generates outer codes which are parity codes $RO_0$--$RO_{305}$ each composed of 10-byte Reed-Solomon code. As shown schematically on FIG. 4, such outer code is added to the end of each data block, which is thereafter outputted as an outer data block DO.

The outer data block DO is fed through a first multiplexer 3 to a memory unit 4. As shown in FIG. 5, the memory unit 4 consists of memories MEM1 and MEM2 each having each capacity of 154 bytes in a row and 128 bytes in each column. In this example, 153 outer data block $DO_0$–$DO_{152}$ inputted sequentially are stored in the memory MEM1, while next 153 outer data blocks $DO_{153}$–$DO_{305}$ inputted sequentially in succession after the outer data blocks $DO_0$–$DO_{152}$ are stored in the memory MEM2 in such a manner that one outer data block is written in each column. The information data of one outer data block is composed of 118 bytes and, since 153 blocks of the information data are written in each of the memories MEM1 and MEM2, it follows that a total of $118 \times 153 \times 2$ bytes (=36,108 bytes) of the information data are written in the memory unit 4.

The data writing direction in each column of the memories MEM1 and MEM2 is indicated by an arrow ARW1 in FIG. 5, and the lower 10 bytes in each column of the memories MEM1 and MEM2 correspond to the outer error code OR.

Data block identification data $ID_B$ generated by an identification data generator 5 for identifying the individual rows in the memories MEM1 and MEM2 are also supplied through the multiplexer 3 to the memory unit 4. Even components $ID_{BE}$ of such data block identification data $ID_B$ are written in the memory MEM1 while odd components $ID_{BD}$ thereof are written in the memory MEM2 column by column in the direction ARW1.

The data thus written in the memories MEM1 and MEM2 are read out therefrom in the direction ARW2 (FIG. 5) in such a manner that the data of each row is processed as one block. The data reading operation for individual rows is performed alternately, with respect to the memories MEM1 and MEM2, in the order conforming to the data block identification data $ID_B$ (00, 01, 02, 03, ... ). The data read out from the memories MEM1 and MEM2 are inputted to an inner encoder 6 (FIG. 3).

Through the use of a predetermined generating polynomial with respect to each of the input data blocks, the inner encoder 6 generates inner or parity codes generating polynomial with regard to each of the input data blocks, inner codes which are parity codes $RI_0$–$RI_{255}$ which each contain an 8-byte Reed-Solomon code. As shown in FIG. 6, such inner codes RI are added to the ends of the respective data blocks to form inner data blocks $DI_0$–$DI_{255}$, which are then outputted to a second multiplexer 7.

The second multiplexer 7 selectively outputs the preamble data PR and the postamble data PS formed by a preamble/postamble generator 8 and also the inner data blocks $DI_0$–$DI_{255}$ outputted from the inner encoder 6. Such data are outputted in the order of the preamble data PR, the inner data blocks $DI_0$–$DI_{255}$ and the postamble data PS. The output of the second multiplexer 7 is fed to a data randomizer 9.

In the data randomizer 9, the data are randomized through the application of an exclusive OR with regard to every byte of the input data and predetermined data. The data thus randomized is inputted to an 8-9 modulator 10.

In this modulator 10, the data are converted from an 8-bit combination to a 9-bit combination for the purpose of achieving a DC-free state by the removal of the DC component from the signal waveform to be recorded on the magnetic tape. Such conversion is performed in the following manner. For each of 256 values of the input data in which each byte is composed of 8 bits, two kinds of 9-bit data are predetermined on the basis of the ID-1 format. Such two kinds of 9-bit data have codeword digital sums (CDS) which are different from each other in polarity. The 8-9 modulator 10 monitors the digital sum variation (DSV) of the 9-bit data outputted in accordance with the input data and selects either of the two kinds of 9-bit data having different CDS values, in such a way as to reduce the DSV value to zero. Thus, the 8-bit input data are converted into DC-free 9-bit data. The 8-9 modulator 10 also includes a circuit for converting the input data of NRZL (non-return to zero level) form into that of NRZI (non-return to zero inverse) form. The 9-bit output data of the 8-9 modulator 10 in NRZL form are inputted to a third multiplexer 11.

In the third multiplexer 11, a sync code $SYNC_B$ of a fixed 4-byte length obtained from a sync code generator 12 (FIG. 3) is added to each of the inner data blocks $DI_0$–$DI_{255}$ for forming sync blocks $BLK_0$–$BLK_{255}$. The pattern of such sync code $SYNC_B$ is determined on the basis of the ID-1 format, and the pattern to be recorded on the magnetic tape is so prescribed as to conform with such code pattern.

The data obtained in the above processes is shown in the form of maps MAP1 and MAP2 in FIG. 7. The output of the third multiplexer 11 has a data array obtained by scanning such maps MAP1 and MAP2 in the horizontal direction. The output of the third multiplexer 11 is fed to a parallel-to-serial converter 13 (FIG. 3).

In the parallel-to-serial converter 13, the input bit-parallel data of preamble PR, sync blocks $BLK_0$–$BLK_{255}$ and postamble PS (FIG. 2) are converted into bit-serial data $S_{REC}$. Such serial data $S_{REC}$ is amplified by a record amplifier 14 and then is supplied as a record signal to a magnetic head 16 which scans the magnetic tape 15 in a helical scanning mode, whereby record tracks TR ( . . . , TR1, TR2, TR3, TR4, . . . ) are obliquely formed on the magnetic tape 15 as illustrated in FIG. 1.

In this manner, the recording system 1 in the data recorder is adapted to add an error correction code, which is based on the Reed-Solomon product code notation, to the desired information data $DT_{USE}$ to be recorded.

The information data $DT_{USE}$ thus recorded on the magnetic tape 15 by the recording system 1 of the data recorder is reproduced by a reproducing system 20 of the data recorder shown in FIG. 8.

The signal processing operation in the reproducing system 20 is exactly inverse to the operation performed in the recording system 1.

In the reproducing system 20 of the data recorder, the record tracks TR ( . . . , TR1, TR2, TR3, TR4, . . . ) on the magnetic tape 15 are reproduced by the magnetic head 16 to become a playback signal $S_{PB}$, which is then inputted to a playback amplifier 21.

The playback amplifier 21 comprises an equalizer and a binary encoder, wherein playback digital data $DT_{PB}$ is obtained by encoding the input playback signal $S_{PB}$ in a binary notation and then is outputted to a serial-to-parallel converter 22. In this converter 22, the serial playback digital data $DT_{PB}$ is converted into 9-bit parallel data $DT_{PR}$.

In a sync code detector 23, the 4-byte sync code $SYNC_B$ is detected from a stream of the parallel data $DT_{PR}$, and the sync block is identified in accordance with the detected sync code. The sync code detector 23 includes a circuit for converting the NRZI-form parallel data $DT_{PR}$ into NRZL-form data.

The output of the sync code detector 23 is fed to a 9-8 demodulator 24, where the data processed by 8-to-9 bit conversion to be rendered DC-free in the recording system is demodulated to provide 8-bit data again. The demodulator 24 may be composed of a ROM (read-only memory) which converts the 9-bit data to 8-bit data by a table retrieval process.

The 8-bit data thus obtained are derandomized in a derandomizer 25 through a process which is the inverse of the randomization executed in the recording system. Such derandomization is achieved by calculating an exclusive OR of the predetermined data used for the randomization and the input data fed to the derandomizer 25.

An inner code error detector/corrector 26 performs error detection and correction by using the 8-byte inner code $RI_0$–$RI_{255}$ added respectively to the inner data blocks $DI_0$–$DI_{255}$ of the identified sync blocks.

The inner data blocks $DI_0$–$DI_{255}$ subjected to such inner code error correction are written in a memory unit 28, which is structurally the same as the aforementioned memory unit 4 (FIG. 5) of the recording system. Such writing in the memory unit 28 is controlled on the basis of the 1-byte block identification data $ID_B$ added to each block detected by an identification data detector 27, in such a manner that one data block is written in one row. The data writing order is the same as the order of reading out the data from the memory unit 4 in the recording system, and the data blocks are written in the memories MEM1 and MEM2 row by row alternately in conformity with the block identification data. The data thus written in the memories MEM1 and MEM2 of the memory unit 28 are read out therefrom in the direction of columns in the same order as the data writing order in the memory unit 4 of the recording system, and consequently the 128-byte outer data blocks $DO_0$–$DO_{306}$ are recovered.

In an outer code error detector/corrector 29, error detection and correction are performed, with regard to the outer data blocks $DO_0$–$DO_{306}$ outputted from the memory unit 28, by using the 10-byte outer code $RO_0$–$RO_{306}$ added to the respective data blocks.

Thus, the information data $DT_{USE}$ recorded on the magnetic tape 15 is reproduced in the manner described above.

In the reproducing system 20 of the data recorder constituted as described above, the playback digital data $DT_{PB}$ inputted in the form of serial data are first converted into parallel data $DT_{PR}$ by the serial-to-parallel converter 22 and then are supplied to the 9-8 demodulator 24.

In the serial-to-parallel converter 22, various sync codes SYNC inserted at the interval of every predetermined byte length of the playback digital data $DT_{PB}$ are detected, and serial-to-parallel conversion is executed.

More specifically, as shown in FIG. 9, in a reproducing circuit 30, the playback digital data $DT_{PB}$ in serial form are inputted to both a serial-to-parallel converter 31 and a sync detector 32. In the sync detector 32, the timing of the sync code SYNC included in the playback digital data $DT_{PB}$ is detected, and the sync detection signal $S_{SYNC}$ obtained as a result of such detection is fed to a sync interpolator 33.

The sync interpolator 33 includes a flywheel counter and, in case the sync code SYNC fails to be detected due to some error, the sync detection signal $S_{SYNC}$ is interpolated in the time series mode, and simultaneously any false sync detection signal $ES_{SYNC}$ generated at an improper timing due to some error is masked.

The proper sync detection signal $S_{SYNC}$ thus interpolated is inputted to the serial-to-parallel converter 31, where the playback digital data $DT_{PB}$ in serial form is converted to parallel data $DT_{PB9}$ while being divided into for example, groups of 9 bits at the timing of the proper sync detection signal $S_{SYNC}$. Subsequently, the parallel data $DT_{PB9}$ thus obtained is demodulated to parallel data $DT_{PB8}$, of which each byte is composed of 8 bits, by the 8-9 demodulator 34, and then is written in a memory 35 having a memory matrix such as has been previously described in connection with FIG. 5.

In the circuit 30, the sync detection signal $S_{SYNC}$ is fed to the serial-to-parallel converter 31 while being fed also to a block counter 36 consisting of row counters and column counters, thereby controlling the write addresses $ADR_{WR}$ of the parallel data $DT_{PB8}$ with regard to the memory 35.

It is generally customary that the sync code SYNC processed in the circuit 30 is composed of 1 or 2 bytes, and therefore the probability of failure in detecting the sync code SYNC due to some error is relatively low, whereas the probability of generation of a false sync detection signal $ES_{SYNC}$ at an improper timing is relatively high.

However, in the magnetic data recorder employing the ID-1 format, each of the sync, codes SYNC including the sync code $SYNC_{PR}$ of the preamble PR, the sync code $SYNC_{BLK}$ of the 256 sync blocks BLK in the data recording portion DT, and the sync code $SYNC_{PS}$ of the postamble PS, is determined to be 36 bits constituting 4 bytes composed respectively of 9-bit data.

Therefore, in the case of employing the ID-1 format, the probability of generation of a false sync detection signal $ES_{SYNC}$ is extremely low, whereas the probability of failure in detecting the sync code SYNC due to some error is high. The foregoing results from the fact that, as mentioned above, the sync code SYNC has a length of 36 bits.

In practice, if the initial sync code SYNC (i.e., the sync code $SYNC_{PR}$ of the preamble PR) of one sector SEC corresponding to one track fails to be properly detected, it is impossible to detect the block sync codes $SYNC_{BLK}$ of succeeding several blocks, so that thereby cause an error results.

In such case, although the inner data DI itself in the sync block BLK is normal, due to the decision signifying the existence of an error in the block sync code $SYNC_{BLK}$, the inner data DI also is considered to be erroneous.

OBJECTS AND SUMMARY OF THE INVENTION

The present invention has for its object to avoid the problems described above.

According to one aspect of the present invention, there is provided an apparatus for transmitting digital data which includes information data and synchronous data having a plural-byte code arranged in a plural-byte code of the information data data: which apparatus comprises a serial-to-parallel converter for converting a serial data stream of the digital data to a parallel data stream at the timing of a predetermined bit of the digital data; a detector for detecting a position of a first-byte code of the synchronous data by comparing each byte of the parallel data stream with one predetermined byte of the synchronous data; an extractor for extracting the synchronous data having a plural-byte code from the parallel data stream in response to an output signal of the detector; and a comparator for comparing the extracted synchronous data with a predetermined pattern of the plural bytes of the synchronous data so as to generate a signal indicating an amount of the bit shift of the extracted synchronous data from the predetermined pattern.

In the digital data transmitting apparatus according to an embodiment of the present invention, input data is first converted into desired parallel data, and then each byte of the parallel data is compared with one byte of a sync code to predict the top bit position of the sync code. Subsequently, the parallel data is extracted by the byte length of the sync code resulting from the predicted tap bit position, and the sync code in the input transmission data is detected. Thus, it becomes possible to perform accurate detection of the sync code without any wasteful comparison in regard to the entirety of the digital transmission data which also includes information data.

In accordance with a feature of this invention, in the event that the sync code is not detected, the past sync code is interpolated on the basis of the detection information of the sync code detected successively thereto, whereby desired sync-code detection information can be obtained with certainty.

The above and other objects, features and advantages invention will become apparent from the following description which which is to be read with reference to the illustrative accompanying drawings.

BRIEF DESCRIPTION OF THE DRAWINGS

FIG. 11 is a table showing selective switching operations of switch circuits included in the embodiment of FIG. 10;

FIGS. 13 and 14 are tables illustrating sync detecting operation in the embodiment of FIG. 10;

FIG. 16 is a table showing selective switching operations of switches included in the embodiment of FIG. 15.

DESCRIPTION OF THE PREFERRED EMBODIMENTS

Exemplary embodiments of the present invention will now be described in detail with reference to the accompanying drawings.

Figure 1:
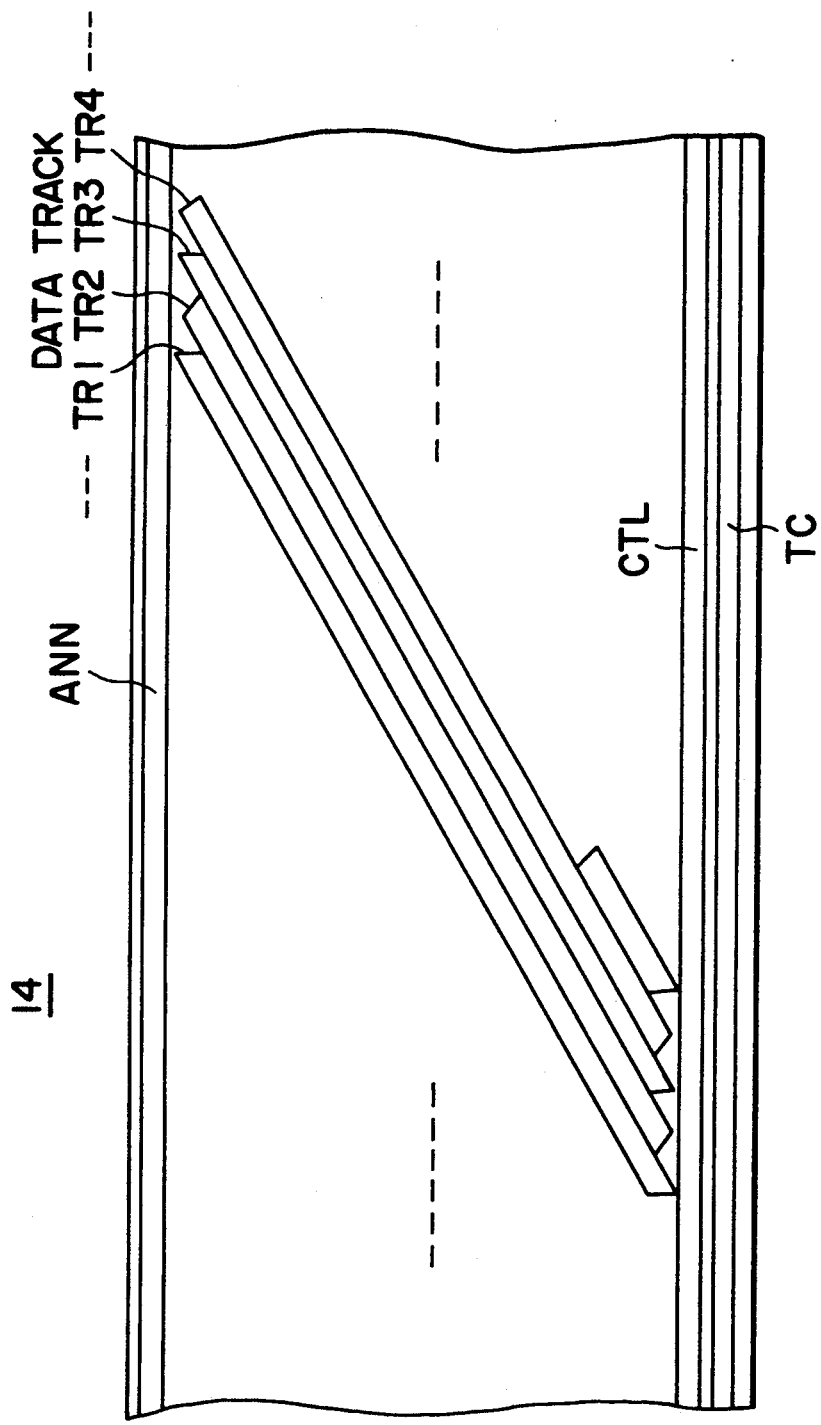
FIG. 1 schematically illustrates a prior art recording format on a magnetic tape.
Figure 2:
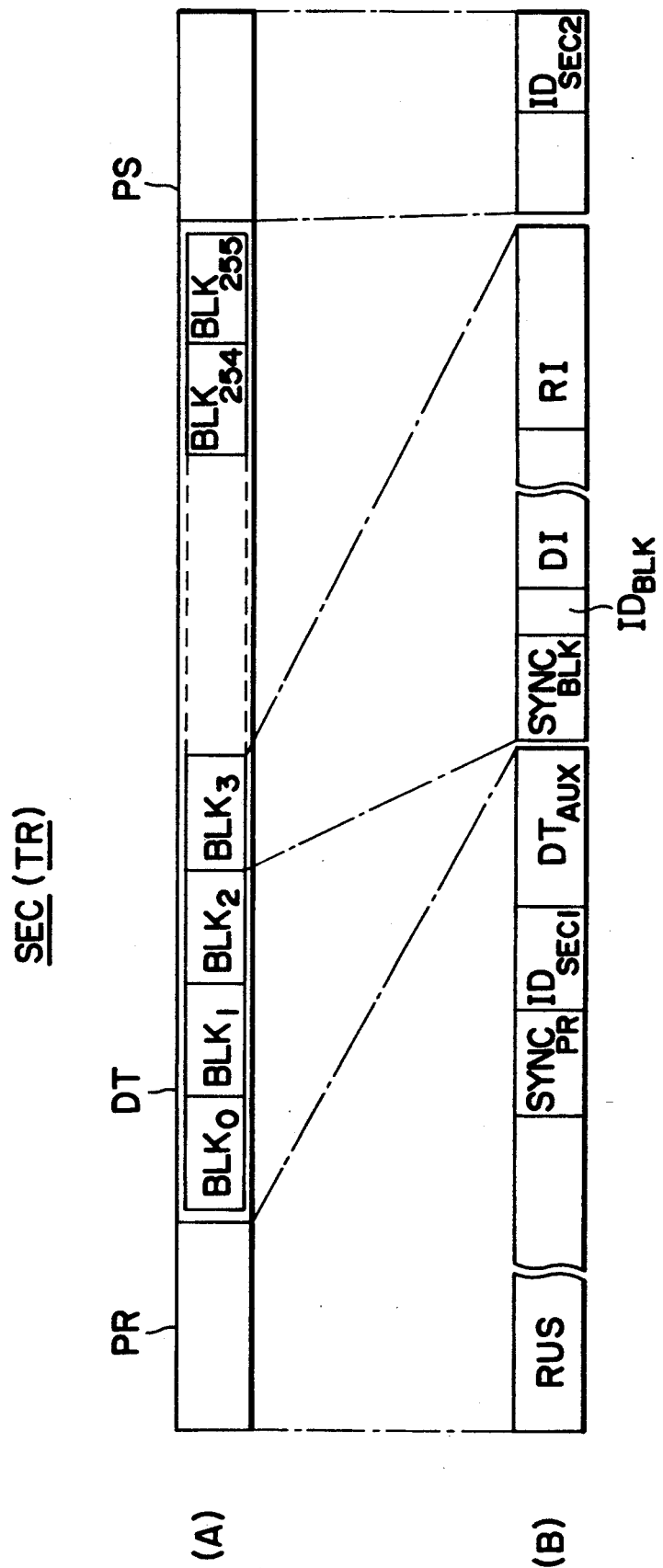
FIG. 2 schematically illustrates the contents in each of the record tracks.
Figure 3:
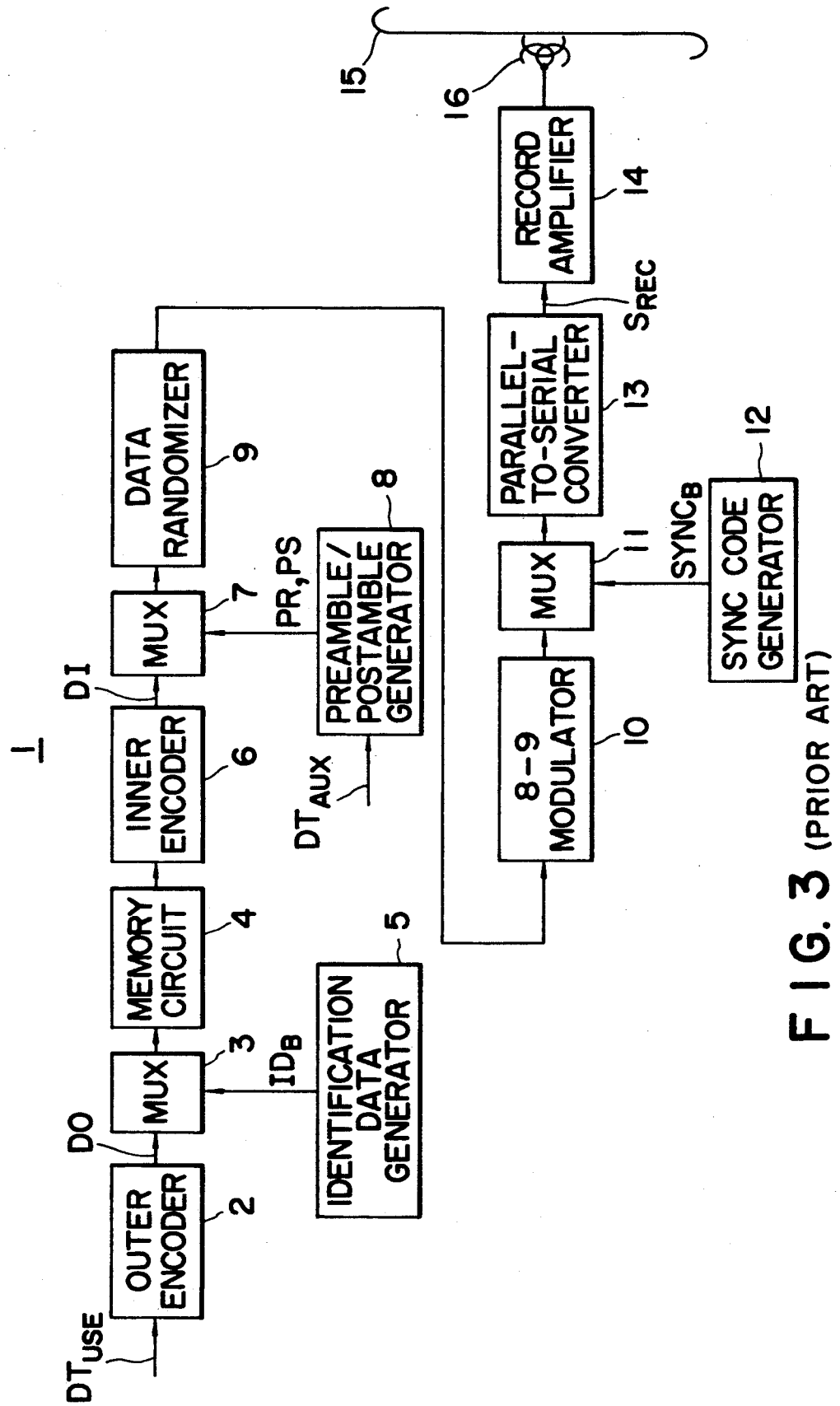
FIG. 3 is a block diagram of a recording system in a magnetic recording/reproducing apparatus, such as, a digital data recorder according to the prior art FIG. 4 schematically illustrates the output data of an outer encoder included in the recording system of FIG. 3.
Figure 4:
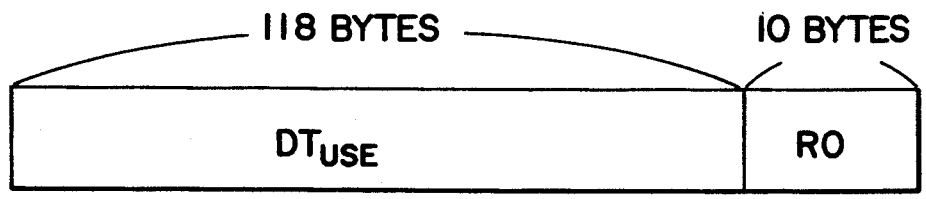
Figure 6:
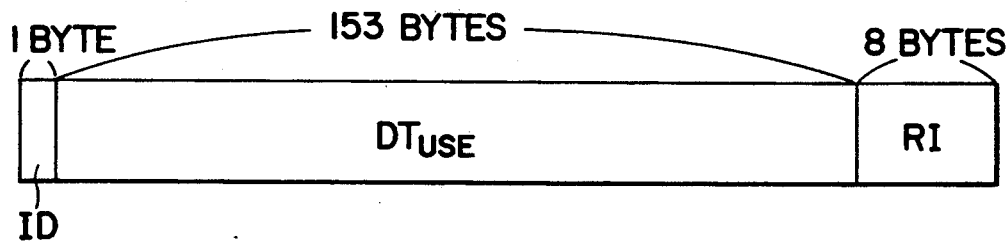
FIG. 6 schematically illustrates the output data of an inner encoder included in the recording system of FIG. 3
Figure 9:
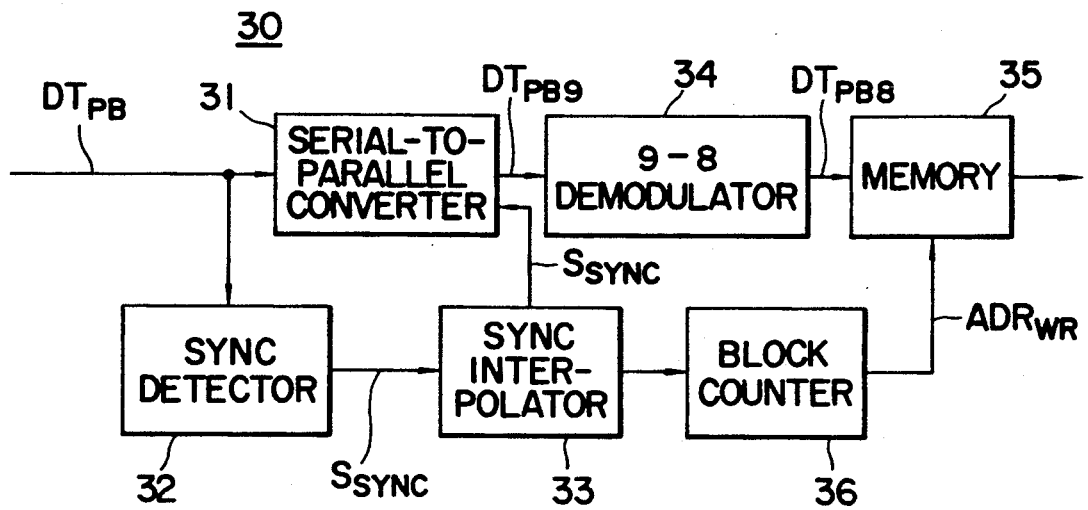
FIG. 9 is a block diagram of a conventional demodulator circuit arrangement that may be employed in the reproducing system of FIG. 8.
Figure 5:
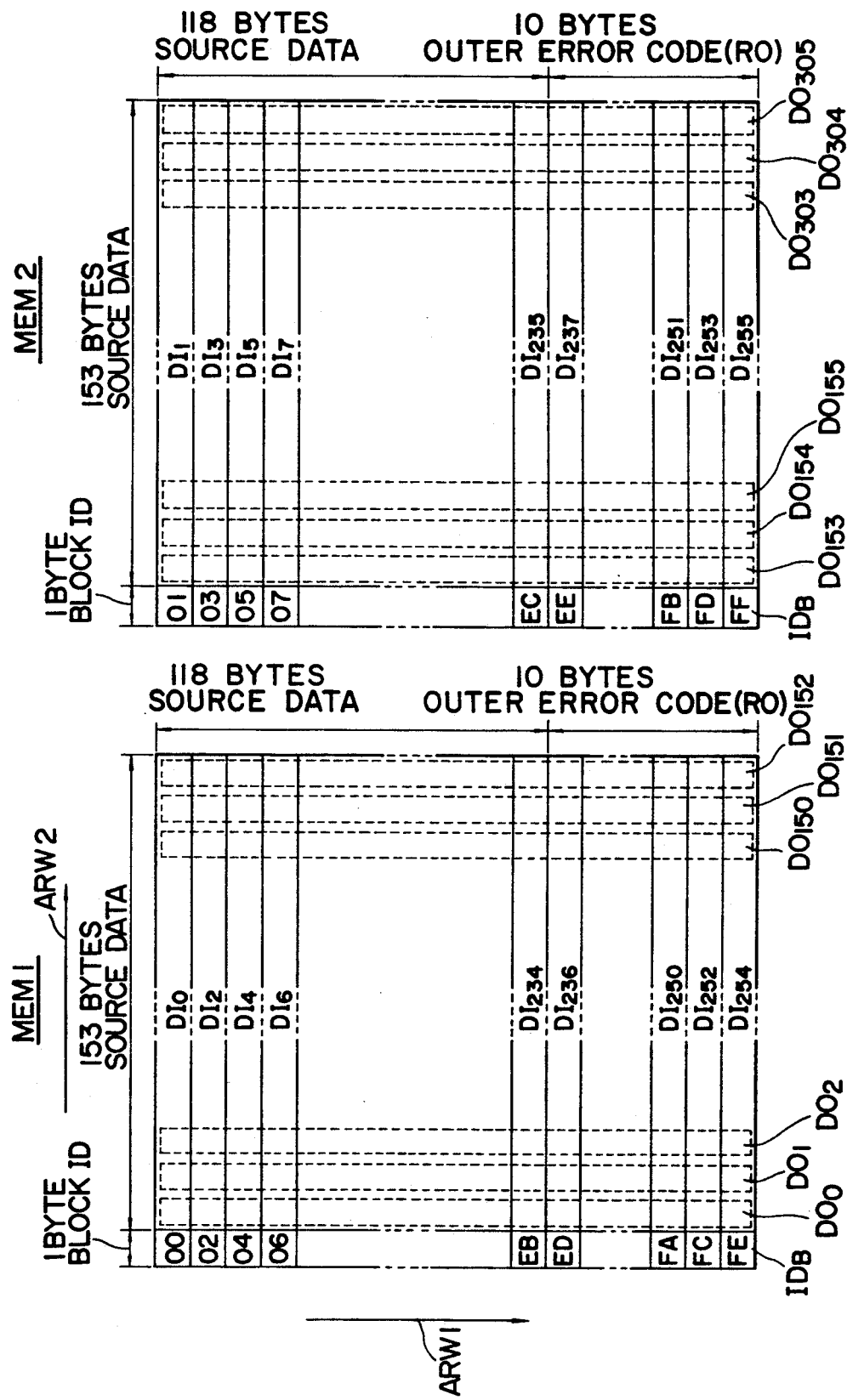
FIG. 5 is a schematic diagram showing a memory unit included in the recording system of FIG. 3
Figure 7:
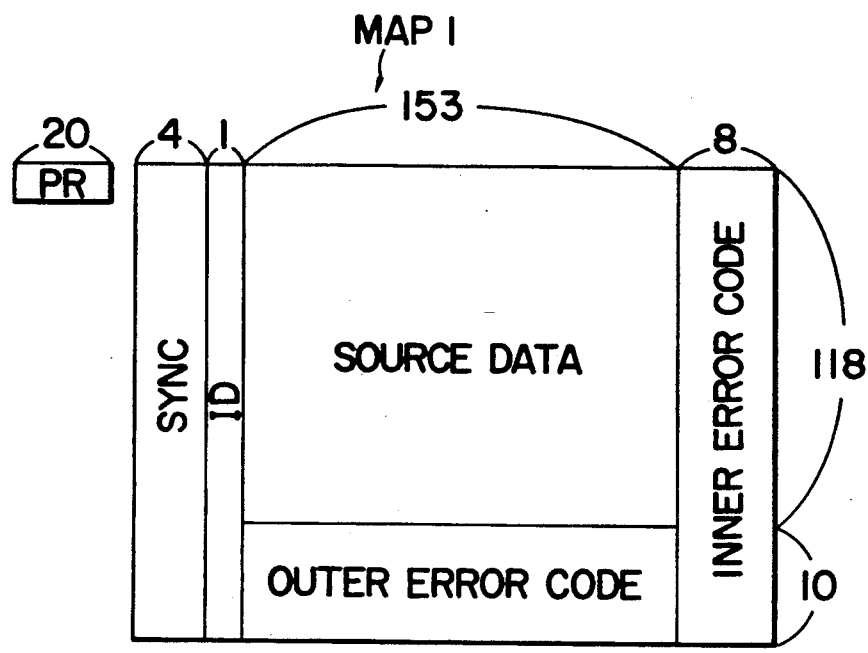
FIG. 7 schematically illustrate data maps which show data in the recording system of FIG. 3.
Figure 7:
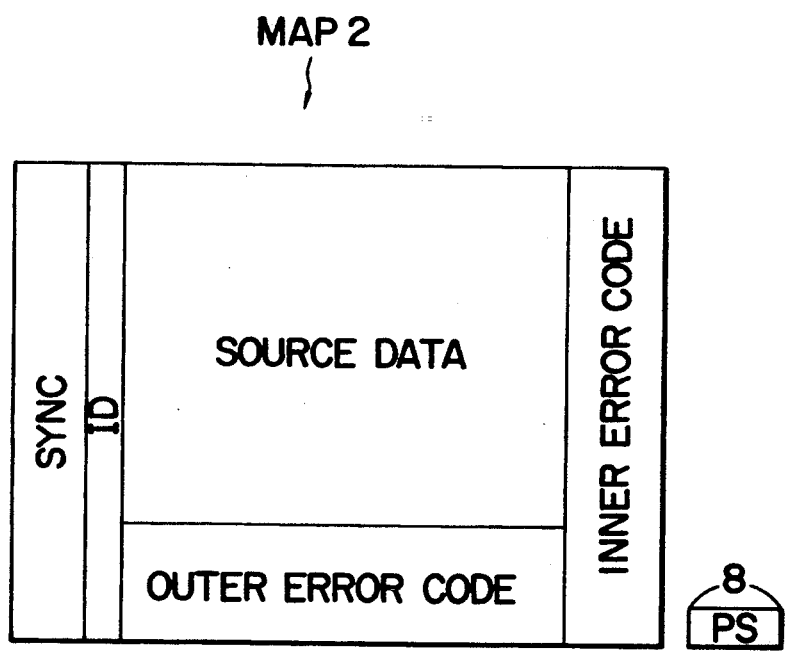

In the magnetic recording/reproducing apparatus or digital data recorder according to such embodiments, information is recorded in conformity with the ID-1 format on a magnetic tape 14 as mentioned above in connection with FIGS. 1 and 2. For example, in a 4-channel process, a maximum of 880 tracks are recorded per second, and the maximum repetition frequency of playback digital data $DT_{PB}$ becomes 88 MHz.

The bit error rate in such ID-1 format is supposed to be $10^{-4}$ as in another format termed SMPTE D-1. In such case, the probability of causing no error in the entire sync codes SYNC of 36-bit length can be expressed as $$(1-10^{-4})^{36} \simeq 1 - 36 \times 10^{-4} \quad (1)$$

Stated another way, the probability of occurrence of an error in the sync code SYNC is $36 \times 10^{-4}$.

The occurrences per second of the block sync code $SYNC_{BLK}$ of the data portion DT can be written as $$880 \times 256 = 225.28 \times 10^3 \quad (2)$$

From the above, it can be calculated that the failure to detect the block sync code $SYNC_{BLK}$ due to random error will have the following probabilities: one continuous failure in detecting the block sync code $SYNC_{BLK}$ occurs once per track; two consecutive failures in detecting the block sync code $SYNC_{BLK}$ occur three times per second; and three consecutive failures in detecting the block sync code $SYNC_{BLK}$ occur once per 9.5 seconds.

Similarly, the calculated probability of four consecutive failures in detecting the block sync code $SYNC_{BLK}$ is once per 7.3 hours, and it is probable that five consecutive failures in detecting the block sync code $SYNC_{BLK}$ will occur once per 84 days. It is further calculated that the probability of the occurrence of five consecutive random errors and resultant failures in detecting the block sync code $SYNC_{BLK}$ is extremely low; whereas the probability of occurrence of three consecutive random errors and resultant failures in detecting the block sync code $SYNC_{BLK}$ is high.

As for the probability of the generation of a false sync detection signal $ES_{SYNC}$ in the case of a magnetization patter in which the sync code SYNC is prescribed, no false sync detection signal $ES_{SYNC}$ is generated when no error occurs. Therefore, even if any one bit of the sync code SYNC is changed, the magnetization pattern subsequent to such change may still be considered to be the existing data pattern.

Relative to the bit error rate Er and the bit length N of the sync code SYNC, the probability of occurrence of an error in a specified bit is expressed as $$(1-Er)^{N-1} \times Er \simeq (1-(N-1)Er) \times Er \quad (3)$$

If an error occurs in the specified bit, the probability of generation of a data pattern corresponding to the sync code SYNC becomes $\frac{1}{2^N}$ which is expressed as $$\frac{(1-(N-1)Er) \times Er}{2^N} \quad (4)$$

Supposing that the above calculation can be adapted for any one of N bits, the probability of generation of a false sync detection signal $ES_{SYNC}$ is expressed as $$(1-(N-1)Er) \times Er \times N/2^N \simeq N \times Er/2^N \quad (5)$$

Assume here that, as mentioned above, the bit error rate Er and the number N of bits of the sync code SYNC are set as $$Er = 1 \times 10^{-4}$$

$$N = 36 \quad (6)$$

Then, the probability of generation of a false sync detection signal $ES_{SYNC}$ is obtained as $5.2386 \times 10^{-14}$ by substituting Eq. (6) in Eq. (5).

The number of detections of the sync code SYNC per second is obtained from the following calculation.

$$880(\text{tracks}) \times 256(\text{blocks}) \times 166(\text{bytes}) \times 9\text{-(bits)} = 3.366 \times 10^8 \quad (7)$$

It is found therefore that the probability of generation of a false sync detection signal $ES_{SYNC}$ is once per 15.7 hours, signifying that the probability of a false SYNC detection signal is practically negligible unless a malfunction of the entire circuit is induced.

In the magnetic recording/reproducing apparatus employing the ID-1 format, the sync code SYNC is composed of 36 bits so that, if the probability of failure in detecting one sync code SYNC is once per record track TR, the probability of failure in detecting the initial or top sync code $SYNC_{PR}$ due to random error corresponds to the probability of occurrence at the beginning of the record track TR. Consequently, a failure occurs once per 256 record tracks TR, that is, 3 to 4 failures per second.

In this manner, if the top sync code $SYNC_{PR}$ fails to be detected, the data of the respective record track is regarded entirely as an error, so that the error of one bit of the sync code $SYNC_{PR}$ is multiplied by 165.

For the purpose of averting the foregoing fault, in the sync detector circuit employed in the magnetic recording/reproducing apparatus or digital data recorder according to an embodiment of this invention, the sync code SYNC is also once stored, together with the input data, in a predetermined buffer memory composed of a delay circuit, and interpolation or utilization of the sync code SYNC is executed retroactively to the instant of detection of the proper sync code SYNC, whereby the data is processed on the basis of such interpolated sync code SYNC.

In the ID-1 format, the sync codes $SYNC_{PR}$ and $SYNC_{PS}$ of the preamble PR and the postamble PS are prescribed to be 36 bits having of the magnetization pattern "000011001 111111110 010111000 000001101", while the block sync code $SYNC_{BLK}$ of the data portion is prescribed to be 36 bits having the magnetization pattern "111100110 000000001 101000111 111110010".

Pratically, for detecting such 36-bit sync code SYNC at a maximum repetition frequency of 88 MHz, it is necessary to compare the 36-bit data within 11 nsec, so that execution of such process is actually difficult even by using the known technique termed ECL logic. However, in the case of the aforementioned interpolation of the sync code SYNC retroactive to the past, detection of the sync code SYNC need not be executed in a real time mode.

Therefore, in the apparatus embodying this invention, the input data is once converted into 9-bit parallel data prior to detection of the sync code SYNC, and an operation is performed to detect the position of the top or first bit of the sync code SYNC among all of the bits and bytes of the relevant parallel data.

First Embodiment

Figure 8:
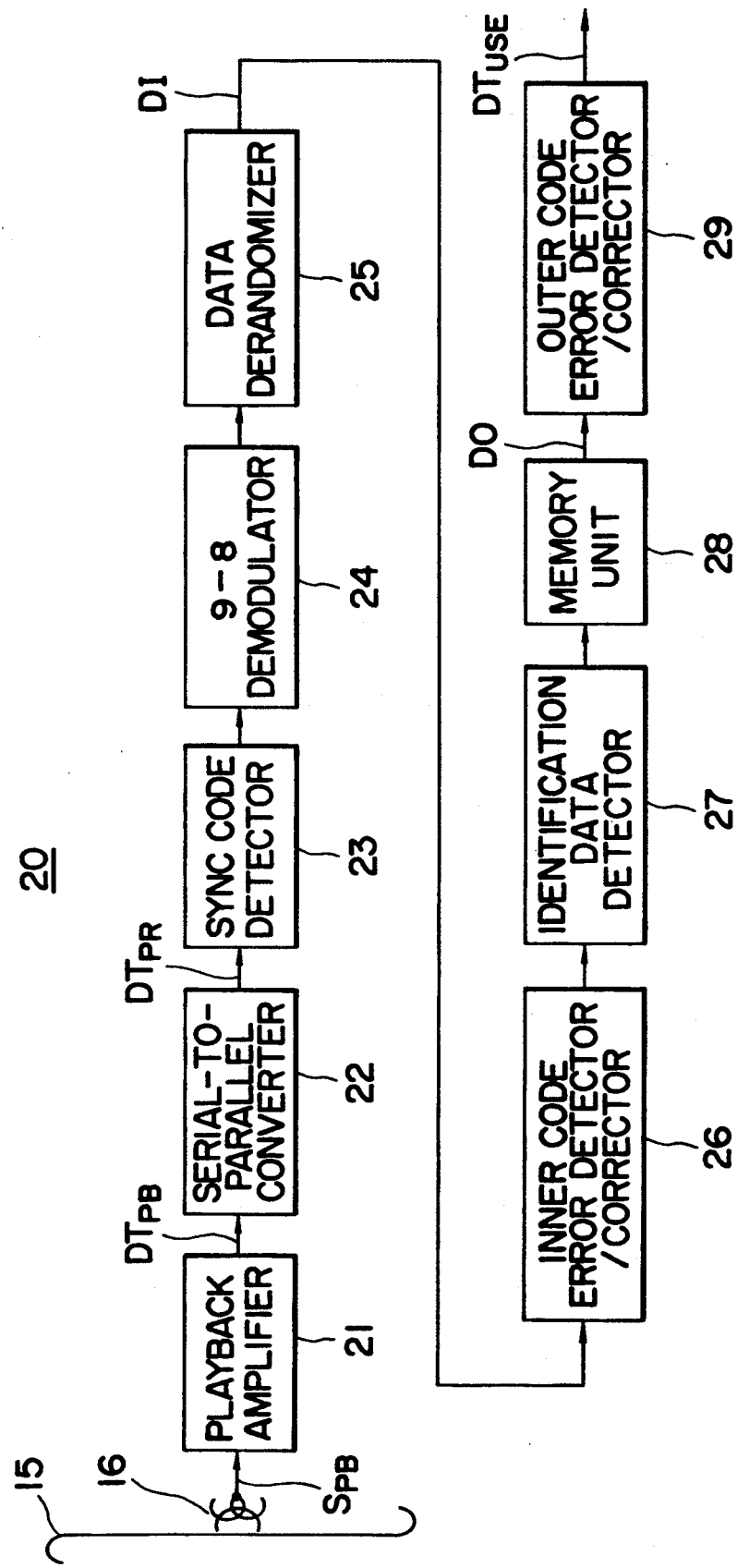
FIG. 8 is a block diagram of a reproducing system in a magnetic recording/reproducing apparatus such as, a digital data recorder according to the prior art.
Figure 10:
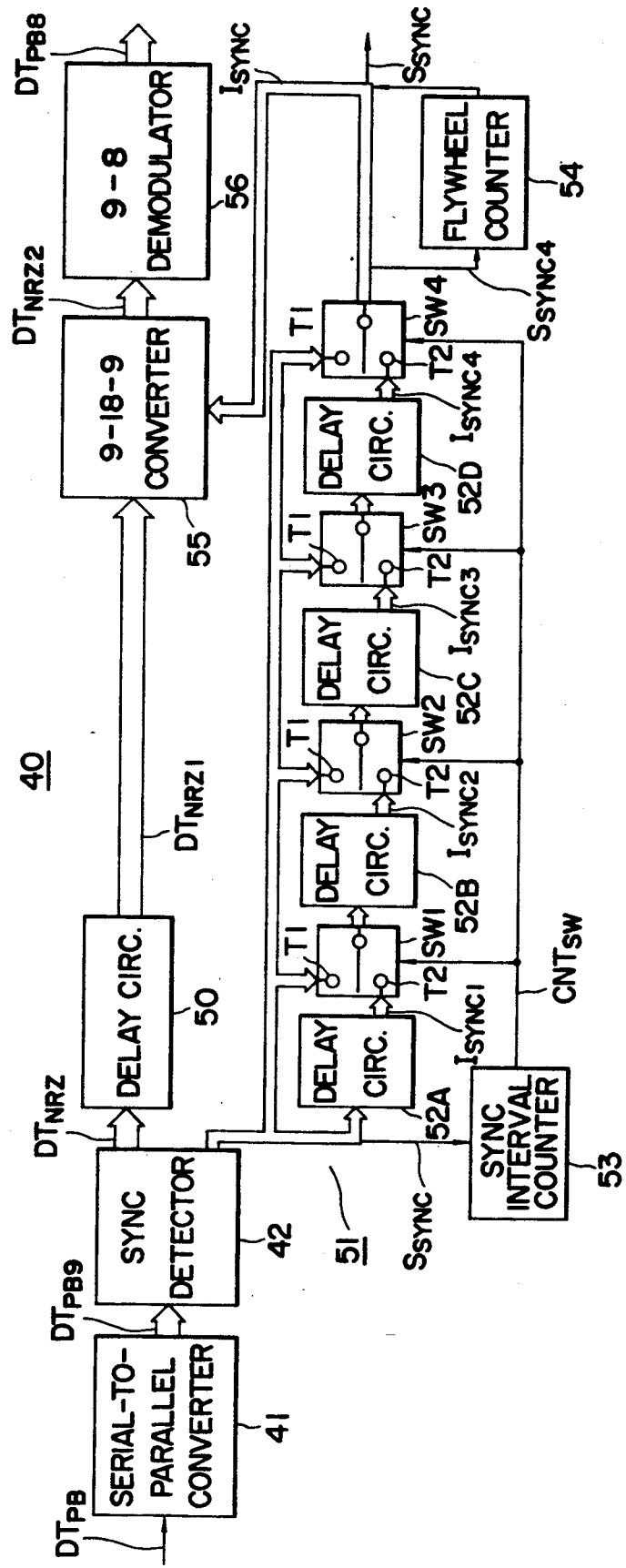
FIG. 10 is a block diagram of a demodulator circuit arrangement for a magnetic recording/reproducing apparatus useful as a digital data recorder according to a first embodiment of the present invention.

Referring now to FIG. 10, it will be seen that reference numeral 40 generally identifies a demodulator circuit arrangement according to a first embodiment of the invention intended for use in a magnetic recording-/reproducing apparatus or digital data recorder in which a recorded signal on a magnetic tape is read out therefrom as a playback signal by means of a magnetic head, and playback digital data $DT_{PB}$ in a binary-coded serial form is supplied from a playback amplifier, for example, as at 21 on FIG. 8, to a serial-to-parallel converter 41.

In the serial-to-parallel converter 41, the playback digital data $DT_{PB}$, which is input at the timing of a parallel clock signal obtained by a 1/9 frequency division of a serial clock signal for the playback digital data $DT_{PB}$, are divided into segments each composed of 9 bits, and the playback data $DT_{PB9}$ composed of the resultant 9-bit parallel data is supplied to a sync detector 42.

Figure 12:
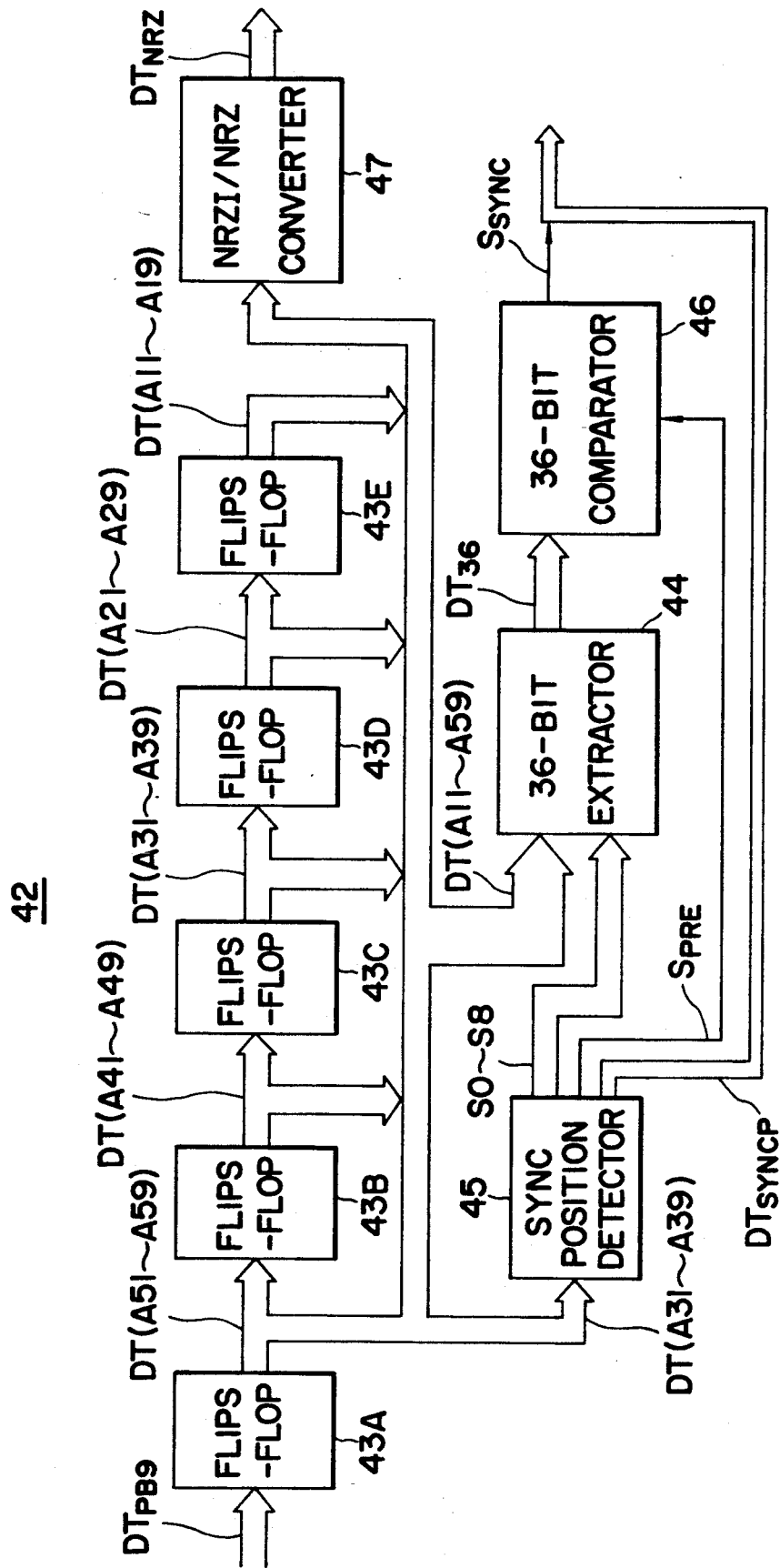
FIG. 12 is a block diagram of a sync detector included in the first embodiment of FIG. 10.

The sync detector 42 may be desirably constituted as shown in FIG. 12, wherein the 9-bit playback data $DT_{PB9}$ are supplied sequentially into first through fifth flip-flops 43A–43E, respectively. Hence, 45-bit parallel data DT (A11–A59) are obtained including the 9-bit output data from the flip-flops 43A–43E, such as, DT (A11–A19), DT (A21–A29), DT (A31–A39), DT (A41–A49), and DT (A51–A59).

The 45-bit parallel data DT (A11–A59) are supplied to a 36-bit extractor 44 while the third byte output data (A31–A39) are input to a sync position detector 45.

The sync position detector 45 is composed of a ROM (read-only memory) which is formed as shown in FIG. 13, wherein the sync codes $SYNC_{PR}$, $SYNC_{PS}$ of the preamble PR and the postamble PS, respectively, and the block sync code $SYNC_{BLK}$ of the data portion, are sequentially shifted toward the least significant bit (LSB) by 0, 1, ..., 7 and 8 bits, respectively. The magnetization pattern obtained in the third byte as a result of such shifts is stored according to the top bit positions 1–9 obtained by adding a value "1" to the individual amounts of shifts, thereby forming a preamble/postamble sync code detection table $TBL_{PR}$ and a data sync code detection table $TBL_{DT}$.

Therefore, in the sync position detector 45, the preamble/postamble sync code detection table $TBL_{PR}$ and the data sync code detection table $TBL_{DT}$ are retrieved with respect to the 9 bit data of the third byte output data DT (A31–A39), and a detection operation is executed to determine whether or not there exists any magnetization pattern coincident with the output data DT (A31–A39).

In the event that a magnetization pattern coincident with the output data DT (A31–A39) exists in the preamble/postamble sync code detection table $TBL_{PR}$ or the data sync code detection table $TBL_{DT}$, the top bit position signal S0–S8 corresponding to such magnetization pattern is fed to the 36-bit extractor 44. Then, a sync code or type identifying signal $S_{PRE}$, which signifies whether the magnetization pattern is the sync code $SYNC_{PR}$ or $SYNC_{PS}$ of the preamble PR or the postamble PS, or the block sync code $SYNC_{BLK}$ of the data portion DT, is fed to a 36-bit comparator 46.

In the sync position detector 45, the top bit position signal S0–S8 is encoded and then is fed as sync position detection data $DT_{SYNCP}$ together with the sync code or type identifying signal $S_{PRE}$.

In the 36-bit extractor 44, as shown in FIG. 14, 36-bit parallel data $DT_{36}$ are extracted from the 45-bit parallel data DT (A11–A59) in accordance with the top bit position signal S0–S8 received from the sync position detector 45, and then are fed to the a 36-bit comparator 46.

The 36-bit comparator 46 has, as comparative reference patterns, a first data pattern $DT_{PTN1}$ ("000011001 111111110 010111000 000001101") relative to the sync codes $SYNC_{PR}$ and $SYNC_{PS}$ of the preamble PR and the postamble PS, and also a second data pattern $DT_{PTN2}$ ("111100110 000000001 101000111 111110010") relative to the sync code $SYNC_{BLK}$ of the data portion DT. Detection is executed as to whether the 36-bit parallel data $DT_{36}$ fed from the 36-bit extractor 44 is coincident with the first or second data pattern $DT_{PTN1}$ or $DT_{PTN2}$ selected in accordance with the sync code identifying signal $S_{PRE}$ fed from the sync position detector 45. When a coincidence is attained between the compared data, the comparator 46 outputs a sync detection signal $S_{SYNC}$ which rises at the time of such coincidence.

Practically, in the sync detector 42, the top bit position signal S0–S8 obtained from the sync position detector 45 and the sync code identifying signal $S_{PRE}$ merely signify that the second byte output data DT (A31–A39) input to the sync position detector 45 has the possibility of becoming a 2nd reference for the sync code SYNC.

Therefore, for precise detection of the sync code SYNC, the 36-bit parallel data $DT_{36}$ are extracted from the 45-bit parallel data DT (A11–A59) in response to the top bit position signal S0–S8 output from the sync position detector 45 and in response to the sync code identifying signal $S_{PRE}$. Then, such extracted data are compared with the data patterns $DT_{PTN1}$ and $DT_{PTN2}$ corresponding to the 36-bit sync code SYNC in accordance with the sync code identifying signal $S_{PRE}$ output from the sync position detector 45.

In the sync detector 42, the 9-bit parallel data DT (A11–A19) output through the fifth flip-flop 43E are fed to an NRZI/NRZ (non-return to zero inverse/non-return to zero) converter 47 which is composed of a combination of exclusive OR gates.

The NRZI/NRZ converter 47 executes an exclusive OR operation of mutually adjacent bits in a parallel data state. Then NRZI-to-NRZ conversion is executed with regard to the 9-bit parallel data DT (A11–A19) of the NRZI code, whereby the 9-bit parallel data $DT_{NRZ}$ of the NRZ code are output.

In this manner, the 9-bit parallel data $DT_{NRZ}$ outputted from the sync detector circuit 42 are fed to a first delay circuit 50 (FIG. 10) which is composed of an FIFO (first-in first-out) memory and provides a delay amount of 4 sync blocks.

In addition, the sync detection information $I_{SYNC}$, which is composed of the sync detection signal $S_{SYNC}$, the sync code identifying signal $S_{PRE}$, and the sync position detection data $DT_{SYNCP}$ obtained from the sync detector 42, is supplied to a sync interpolator 51 (FIG. 10).

In the sync interpolator 51, the sync detection information $I_{SYNC}$ is fed to a delay circuit 52A and to input terminals T1 of switch circuits SW1–SW4 each composed of a selector, and simultaneously the sync detection signal $S_{SYNC}$ included in the sync detection information $I_{SYNC}$ is supplied to a sync interval counter 53.

The sync interval counter 53 monitors the sync detection signal $S_{SYNC}$ at an interval of one sync block and counts the number of blocks from which the sync detection signal $S_{SYNC}$, normally appearing periodically for each sync block, has been absent. Depending on the result of such count, a switch control signal $CNT_{SW}$ is supplied from the counter 53 for selectively controlling the actions of switch circuits SW1–SW4.

Delay sync detection information $I_{SYNC1}$ obtained from delay circuit 52A is fed to an input terminal T2 of the switch circuit SW1, and its output is fed to a delay circuit 52B.

Similarly to the above, delay sync detection information $I_{SYNC2}$–$I_{SYNC4}$ obtained from the through delay circuits 52B–52D are fed respectively to the input terminals T2 of the switch circuits SW2–SW4, and the outputs of the switch circuits SW2 and SW3 are fed to the delay circuits 52C and 52D.

Each of the delay circuits 52A–52D is composed of an FIFO memory similarly to the 1st delay circuit 50 and provides a delay corresponding to one sync block.

Therefore, when the input sync detection information $I_{SYNC}$ passes through the entire path of the delay circuits 52A–52D, that is, when the input terminals T2 of the switch circuits SW1–SW4 are selected by the switch control signal $CNT_{SW}$, from the sync interval counter 53, then the delay amount is equal to the delay of the 9-bit parallel data $DT_{NRZ}$ by the delay circuit 50.

Accordingly, in the event that the sync detection signal $S_{SYNC}$ is not detected during a time corresponding to one sync block for example, the sync interval counter 53 produces a switch control signal $CNT_{SW}$ which serves to select the input terminal T1 of only the switch circuit SW1 while selecting the input terminals T2 of the switch circuits SW2–SW4. In this manner, only the sync detection information $I_{SYNC}$ is delayed for a time corresponding to three sync blocks, whereby interpolation is performed with regard to the sync detection information $I_{SYNC}$ is not detected.

In the sync interval counter 53, the switch control signal $CNT_{SW}$ is controlled so that, as shown in FIG. 11, the input terminals T1 or T2 of the switch circuits SW1–SW4 are selected in accordance with the number of the sync blocks in which the sync detection signal $S_{SYNC}$ has not been detected, so that interpolation can be achieved for up to a maximum of four sync blocks in which there has been a failure to detect the signal $S_{SYNC}$.

Further in the sync interpolator 51, if the sync detection signal $S_{SYNC}$ fails to be detected for a time longer than five sync blocks, the sync detection signal $S_{SYNC}$ included in the delayed sync detection information $I_{SYNC4}$ from the switch circuit SW4 is fed to a flywheel counter 54, so that the sync detection information $I_{SYNC}$ can be interpolated on the basis of the preceding sync detection information $I_{SYNC}$ which was properly detected or, in other words, so that the proceeding sync detection information $I_{SYNC}$ which was last properly detected may be utilized.

Thus, the sync interpolator 51 is effective when the sync detection signal $S_{SYNC}$ fails to be detected for a time corresponding to a maximum of four sync blocks, to interpolate the past sync information $I_{SYNC}$ by the use of new sync information $I_{SYNC}$. On the other hand, when the sync detection signal $S_{SYNC}$ fails to be detected for more than a time corresponding to five sync blocks, new sync information $I_{SYNC}$ is interpolated by using the past sync information $I_{SYNC}$. In this manner, the sync information $I_{SYNC}$ can be interpolated practically a sufficient precision, and the sync information $I_{SYNC}$ is supplied to a 9-18-9 converter 55, while the sync detection signal $S_{SYNC}$ included in the sync information $I_{SYNC}$ may be supplied to a block counter (not shown) which generates a write address for a memory (not shown).

In the 9-18-9 converter 55, 18-bit data is produced out of two bytes by sequentially shifting, byte by byte, the 9-bit parallel data $DT_{NRZI}$ of four sync blocks supplied with delay from the delay circuit 50.

Subsequently, in the 9-18-9 converter 55, 9-bit data is extracted from the 18-bit data, by the same technique as adopted in the 36-bit extractor 44 (FIG. 12), on the basis of the sync position detection data $DT_{SYNCP}$ included in the sync detection information $I_{SYNC}$ supplied from the sync interpolator 51, thereby producing 9-bit parallel data $DT_{NRZ2}$ divided at proper bit positions in accordance with the sync position detection data $DT_{SYNCP}$, and the parallel data $DT_{NRZ2}$ thus obtained is fed to a next 9-8 demodulator 56.

The 9-8 demodulator 56 is composed of a ROM in which the code conversion table is stored. 8-bit parallel data $DT_{PB8}$ obtained from the input 9-bit parallel data $DT_{NRZ2}$ on the basis of the ID-1 format are stored in a memory in accordance with a memory address outputted from a block counter.

In operation of the above described embodiment of the invention, when the sync code of a 36-bit length is detected from the playback data, the playback data is converted to 9-bit parallel data at a desired timing, and the top position of the sync code is predicted by continuously monitoring one byte of the parallel data. And 36-bit parallel data conforming to the sync code are extracted in accordance with the result of such prediction and then is compared with the sync code data pattern, whereby the sync code of a 36-bit length can be accurately detected with a simplified arrangement.

In the event that the sync code fails to be detected, the sync detection information is interpolated retroactively to the past on the basis of the sync detection information of the sync code detected after such failure, so that interpolation of the sync detection information is achieved with certain detection of the sync code.

Thus, it becomes possible to realize a magnetic recording/reproducing apparatus or a digital data recorder which is capable of processing the playback data by properly detecting the sync code even when the sync code in the playback data has a considerable length of 36 bits.

Second Embodiment

Figure 15:
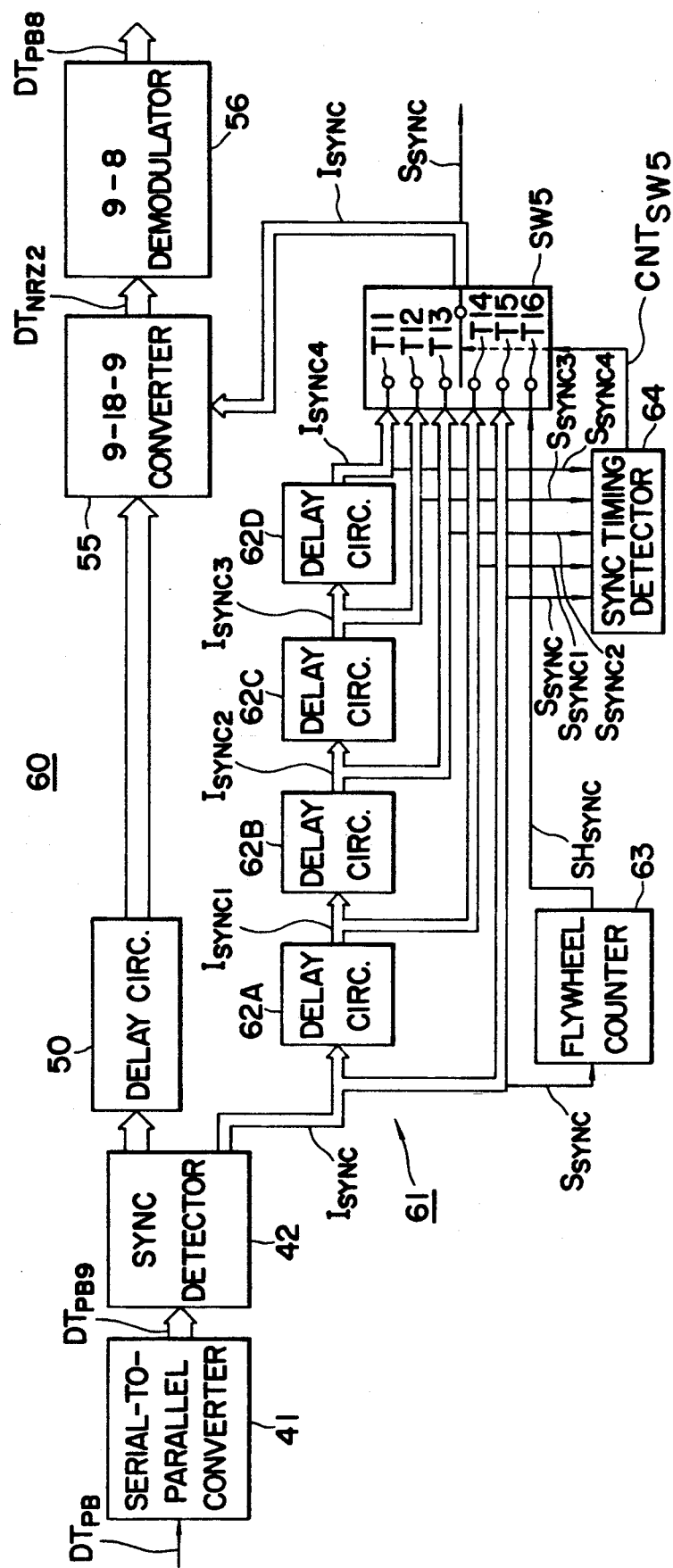
FIG. 15 is a block diagram of a demodulator circuit arrangement according to a second embodiment of the invention.

The reference numeral 60 in FIG. 15 generally identifies a demodulator circuit arrangement according to second embodiment of the present invention, and in which components corresponding to those described with reference to FIG. 10 are denoted by the same reference numerals and symbols. In the embodiment of FIG. 15, a sync interpolator 61 receives sync detection information $I_{SYNC}$ which is composed of a sync detection signal $S_{SYNC}$, a sync code identifying signal $S_{PRE}$, and sync position detection data $DT_{SYNCP}$ from a sync detector 42.

The sync detection information $I_{SYNC}$ is inputted to both a delay circuit 62A and an input terminal T15 of a switch circuit SW5 acting as a selector. The sync detection signal $S_{SYNC}$ included in the sync detection information $I_{SYNC}$ is supplied to both a flywheel counter 63 and a sync timing detector 64.

The delayed sync detection information $I_{SYNC1}$ from the delay circuit 62A is fed to both another delay circuit 62B and an input terminal T14 of the switch circuit SW5, while the sync detection signal $S_{SYNC1}$ included in the delayed sync detection information $I_{SYNC1}$ is supplied to the a sync timing detector 64.

Similarly, delay circuits 62C and 62D are connected in succession to the delay circuit 62B, and the delayed sync detection information $I_{SYNC2}$ and $I_{SYNC3}$ from the delay circuits 62B and 62C are fed to delay circuits 62C and 62D, respectively, and also to input terminals T13 and T12, respectively, of the switch circuit SW5.

The sync detection signal $S_{SYNC2}$ and $S_{SYNC3}$ included respectively in the delayed sync detection information $I_{SYNC2}$ and $I_{SYNC3}$ are also fed to the sync timing detector 64.

Further similarly to the above, the delayed sync detection information $I_{SYNC4}$ from the delay circuit 62D is fed to an input terminal T11 of the switch circuit SW5, and the sync detection signal $S_{SYNC4}$ included in the delayed sync detection information $I_{SYNC4}$ is fed to the sync timing detector 64.

As earlier noted, the flywheel counter 63 receives the sync detection signal $S_{SYNC}$ included in the sync detection information $I_{SYNC}$ and generates, out of the last properly detected sync detection signal $S_{SYNC}$, a sync interpolation signal $SH_{SYNC}$ conforming to the timing of such sync detection signal $S_{SYNC}$. The signal $SH_{SYNC}$ thus generated is fed to an input terminal T16 of the switch circuit SW5.

In operation the sync timing detector 64 outputs a switch control signal $CNT_{SW5}$ for selecting one of the input terminals T11–T16 of the switch circuit SW5 as shown in FIG. 16, in accordance with the sync detection signals $S_{SYNC}$ and $S_{SYNC1}$–$S_{SYNC4}$ included in the sync detection information $I_{SYNC4}$, respectively. and the delayed sync detection information $I_{SYNC1}$–$I_{SYNC4}$.

In FIG. 16, a value "1" represents the presence of the sync detection signal $S_{SYNC}$ or $S_{SYNC1}$–$S_{SYNC4}$, while a value "0" represents the absence of such signal, and a sign "x" indicates that the presence or absence of the respective sync detection signal is irrelevant to the selection of the respective terminal of the switch circuit SW5. detection signal $S_{SYNC}$ is not detected during a time corresponding to one sync block, that is, when the sync detection signal $S_{SYNC4}$ from the delay circuit 62D is not present, then the sync timing detector 64 generates a switch control signal $CNT_{SW5}$ for selecting the input terminal T12 to delay only the sync detection information $I_{SYNC}$ for a time corresponding to three sync blocks, thereby interpolating the sync detection information $I_{SYNC}$ which has not been detected.

Thus, similarly to the operation described above in respect to the sync interpolator 41, in the sync interpolator. 61, the sync detection information $I_{SYNC}$ and the delayed sync detection information $I_{SYNC1}$–$I_{SYNC4}$ are selectively supplied to the 9–18–9 converter 55 in case the sync detection signal $S_{SYNC}$ fails to be detected for a time corresponding to a maximum of four sync blocks, whereby desired interpolation can be performed.

Further, in the sync interpolator 61, if the sync detection signal $S_{SYNC}$ fails to be detected for more than a time corresponding to five sync blocks, the input terminal T16 is selected for outputting the sync interpolation signal $SH_{SYNC}$ obtained from the flywheel counter 63, whereby the sync detection information $I_{SYNC}$ can be interpolated on the basis of the last preceding sync detection information $I_{SYNC}$ that was properly detected.

According to the above, upon occurrence of a failure in detecting the sync code, the sync detection information is interpolated retroactively on the basis of the sync detection information of the sync code detected thereafter, so that interpolation of the sync detection information can be achieved with accurate detection of the sync code. Thus, the embodiment of the invention described with reference to FIG. 15 makes it possible to realize, as in the embodiment described with reference to FIG. 10, a magnetic recording/reproducing apparatus which is capable of processing the playback data by properly detecting the sync code even when the sync code in the playback data has a considerable length of, for example, 36.

In the above described preferred embodiments, delay circuits 50 for four sync blocks are disposed in the playback data transmitting system, and also delay circuits 52A–52D or 62A–62D for four sync blocks are arranged in the sync interpolator in conformity therewith to perform sync interpolation. However, the amount of delay in each of the playback data transmitting system and the sync interpolator may be selectively changed in compliance with any adequate number of sync blocks conforming to individual requirements.

The foregoing embodiments have been described in connection with an exemplary case of applying the present invention to a magnetic recording/reproducing apparatus or digital data recorder employing the ID-1 format. It is to be understood, however, that the present invention is not limited to such embodiments alone and may be widely applied to any apparatus which transmits information data by dividing the same into segments with a sync code of a relatively great bit length.

What is claimed is:

1. An apparatus for reproducing digital data which includes information data and synchronous data, and in which said synchronous data has a plural-byte code arranged in a plural-byte code of said information data, said apparatus comprising:

serial-to-parallel converter means for converting a serial data stream of said digital data to a parallel data stream;

detector means for detecting a position of a first-byte code of said synchronous data by comparing each byte of said parallel data stream with a predetermined byte of said synchronous data and providing an output signal corresponding to the detected position;

extractor means for extracting a portion of said synchronous data having said plural-byte code from said parallel data stream in response to said output signal from said detector means; and comparator means for comparing the extracted portion of said synchronous data with a predetermined pattern of data having a plural-byte code so as to generate a signal when said extracted portion of said synchronous data coincides with said predetermined pattern.

2. An apparatus for detecting a plurality of plural-byte sync codes in reproduced digital data which includes information data and synchronous data, in which said synchronous data has each of said plural-byte sync codes arranged in a plural-byte code of said information data, said apparatus comprising:

serial-to-parallel converting means for converting a serial data stream of said digital data to a parallel data stream;

detector means comparing each byte of said parallel data stream with at least one byte of predetermined data for detecting a first bit position of one of the sync codes;

extracting means for extracting from said parallel data stream a predetermined length of the respective sync code starting from the detected first bit position of the sync code; and means for comparing said predetermined length of said respective sync code extracted from said parallel data stream with a predetermined pattern of data having a code so as to detect the respective plural-byte sync code.

3. An apparatus as in claim 2; further comprising means for utilizing one of a previously detected sync code and a subsequently detected sync code in the event of a failure to detect the respective plural-byte sync code in said reproduced digital data.

4. An apparatus as in claim 3; in which said means for utilizing uses the sync code last previously detected when said failure to detect occurs for more than a predetermined period, and said means for utilizing uses the subsequent sync code next detected when said failure to detect occurs for less than said predetermined period.

* * * * *